United States Patent [19]
Miyamoto

[11] Patent Number: 5,422,853
[45] Date of Patent: Jun. 6, 1995

[54] SENSE AMPLIFIER CONTROL CIRCUIT FOR SEMICONDUCTOR MEMORY

[75] Inventor: Sampei Miyamoto, Tokyo, Japan

[73] Assignee: Oki Electric Industry Co., Ltd., Tokyo, Japan

[21] Appl. No.: 156,360

[22] Filed: Nov. 23, 1993

[30] Foreign Application Priority Data

Nov. 24, 1992 [JP] Japan .................................. 4-313053

[51] Int. Cl.⁶ .............................................. G11C 5/02
[52] U.S. Cl. ...................................... 365/205; 365/51; 365/63; 365/207
[58] Field of Search ................... 365/205, 51, 63, 207, 365/208, 203; 357/530

[56] References Cited

U.S. PATENT DOCUMENTS

| | | | |
|---|---|---|---|
| 4,948,993 | 8/1990 | Chin et al. | 365/205 |
| 5,021,998 | 6/1991 | Suzuki et al. | 365/51 |
| 5,051,955 | 9/1991 | Kobayashi et al. | 365/205 |
| 5,293,559 | 3/1994 | Kim et al. | 365/63 |

FOREIGN PATENT DOCUMENTS 2-27591  1/1990  Japan .

Primary Examiner—Joseph A. Popek
Assistant Examiner—Vu Le
Attorney, Agent, or Firm—Edward D. Manzo

[57] ABSTRACT

A sense amplifier control circuit supplies a first potential to the sense amplifiers of a semiconductor memory through a set of first control transistors, each coupled in parallel to at least two and at most four sense-amplifier nodes. The first transistors are switched by a first control signal line. A second potential may be supplied to the sense amplifiers through a similar set of second control transistors, which are switched by a second control signal line. The first and second control signal lines may be driven independently, or one or both control signal lines may be driven by a set of drivers coupled in parallel between the two control signal lines.

17 Claims, 7 Drawing Sheets

SENSE AMPLIFIER CONTROL CIRCUIT FOR SEMICONDUCTOR MEMORY

BACKGROUND OF THE INVENTION

This invention relates to an improved circuit for controlling the sense amplifiers in a semiconductor memory.

A semiconductor memory has a memory cell array comprising a grid of bit lines and word lines, with memory cells disposed at intersections of the bit lines and word lines. When data are read from the memory cells, sense amplifiers amplify potential differences between pairs of bit lines, thereby enabling data stored in the memory cells to be transferred to input/output circuits. Each sense amplifier is coupled to a pair of nodes which are in turn coupled through control transistors to power-supply and ground potentials. Control of the sense amplifiers consists in turning the control transistors on when the memory is accessed and off at other times.

One conventional sense amplifier control circuit has a single control transistor for the power-supply potential and a single control transistor for the ground potential. Each control transistor is coupled by a long supply line to the appropriate sense-amplifier nodes. One resulting problem is that all sense-amplifier current is channeled through a single point on the power-supply side and a single point on the ground side; the sizable current flow at these points leads to significant power-supply and ground noise. Another problem is that parasitic resistance on the long supply lines slows the operation of sense amplifiers that are distant from the control transistors. If the supply lines are widened to reduce the parasitic resistance, however, they take up too much space in the memory device.

In another conventional design the memory cell array is divided into sections, each having a pair of control transistors through which the nodes of sense amplifiers in the section are coupled to the power supply and ground. The control transistors are disposed in word-line shunt areas. This arrangement reduces the parasitic resistance of the supply lines, and reduces power-supply and ground noise, but introduces a new problem: the control transistors on the ground side (or power-supply side) are all driven by a single signal line; now it is the parasitic resistance of this long, heavily-loaded signal line that slows the operation of the sense amplifiers. In addition, space in the word-line shunt areas is limited, which restricts the gate width, hence the current-handling ability, of the control transistors. The narrow gate width of the control transistors becomes another factor limiting the speed of operation.

In yet another conventional design, each sense amplifier has its own pair of control transistors. The total gate width of the control transistors now provides adequate current-handling capability, but the parasitic resistance of the long, heavily-loaded signal lines that control the control transistors is still a problem. In addition, although the total gate width of the control transistors may be large, the gate of each individual control transistor is so small that narrow-channel effects become evident, and variability in the fabrication process can significantly affect transistor characteristics. Under these conditions it is difficult to optimize the dimensions of the control transistors.

SUMMARY OF THE INVENTION

It is accordingly an object of the present invention to reduce parasitic resistance on the lines supplying power-supply and ground potentials to sense amplifiers.

Another object of the invention is to reduce power-supply and ground noise.

Yet another object is to provide adequate gate width in the control transistors that supply power-supply and ground potentials to sense amplifiers.

Still another object is to avoid delays on the signal lines controlling these control transistors.

The invented sense amplifier control circuit has a plurality of first control transistors through which a first potential is fed to the sense amplifiers of a semiconductor memory. Each first control transistor is coupled in parallel to at least two and at most four sense amplifiers. The first transistors are all switched by a first control signal line.

A second potential may similarly be fed to the sense amplifiers through a plurality of second control transistors, each of which is coupled in parallel to at least two and at most four sense amplifiers. The second transistors are all switched by a second control signal line.

The first and second control signal lines may be driven independently, or the second control signal line may be driven at a plurality of points by a plurality of drivers, which are coupled in parallel between the first and second control signal lines. Alternatively, the first and second control signal lines may both be driven at a plurality of points by a plurality of drivers, which are switched by a third control signal line to which the drivers are coupled in parallel.

DETAILED DESCRIPTION OF THE INVENTION

Embodiments of the invention will be described with reference to the attached drawings. These drawings illustrate the invention but do not restrict its scope, which should be determined solely from the appended claims.

Figure 1:
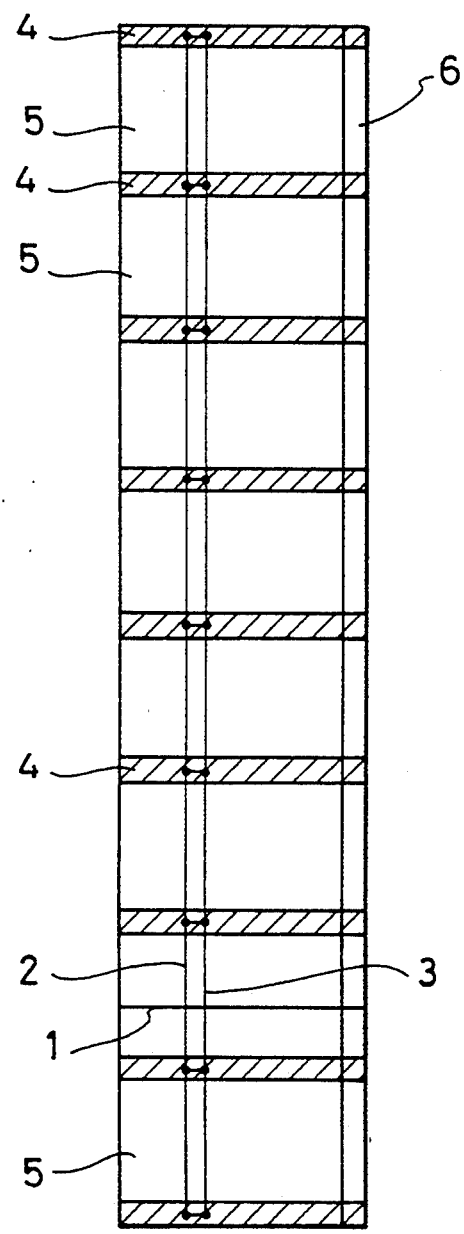
FIG. 1 illustrates bit, word, and shunt lines in a semiconductor memory.

FIG. 1 is a very general diagram showing the memory cell array of one type of semiconductor memory in which the invention can be employed. The array is criss-crossed by a grid of metal bit lines 1 and polysilicon word lines 2, the bit lines 1 running horizontally in the drawing and the word lines 2 vertically. (Only one bit line 1 and word line 2 are shown in the drawing.) Memory cells (not indicated in the drawing) are located at intersections of the bit lines 1 and word lines 2. The bit lines 1 form complementary pairs which will be denoted BL and $\overline{BL}$ in subsequent drawings.

Each polysilicon word line 2 is paralleled by a metal shunt line 3 with which it makes contact in a plurality of word-line shunt areas 4. These word-line shunt areas 4 divide the memory cell array into a plurality of sections 5. The metal shunt lines 3 reduce the electrical resistance inherent in the polysilicon word lines 2.

A sense-amplifier area 6 is disposed on one side of the memory cell array, parallel to the word lines 2.

Figure 2:
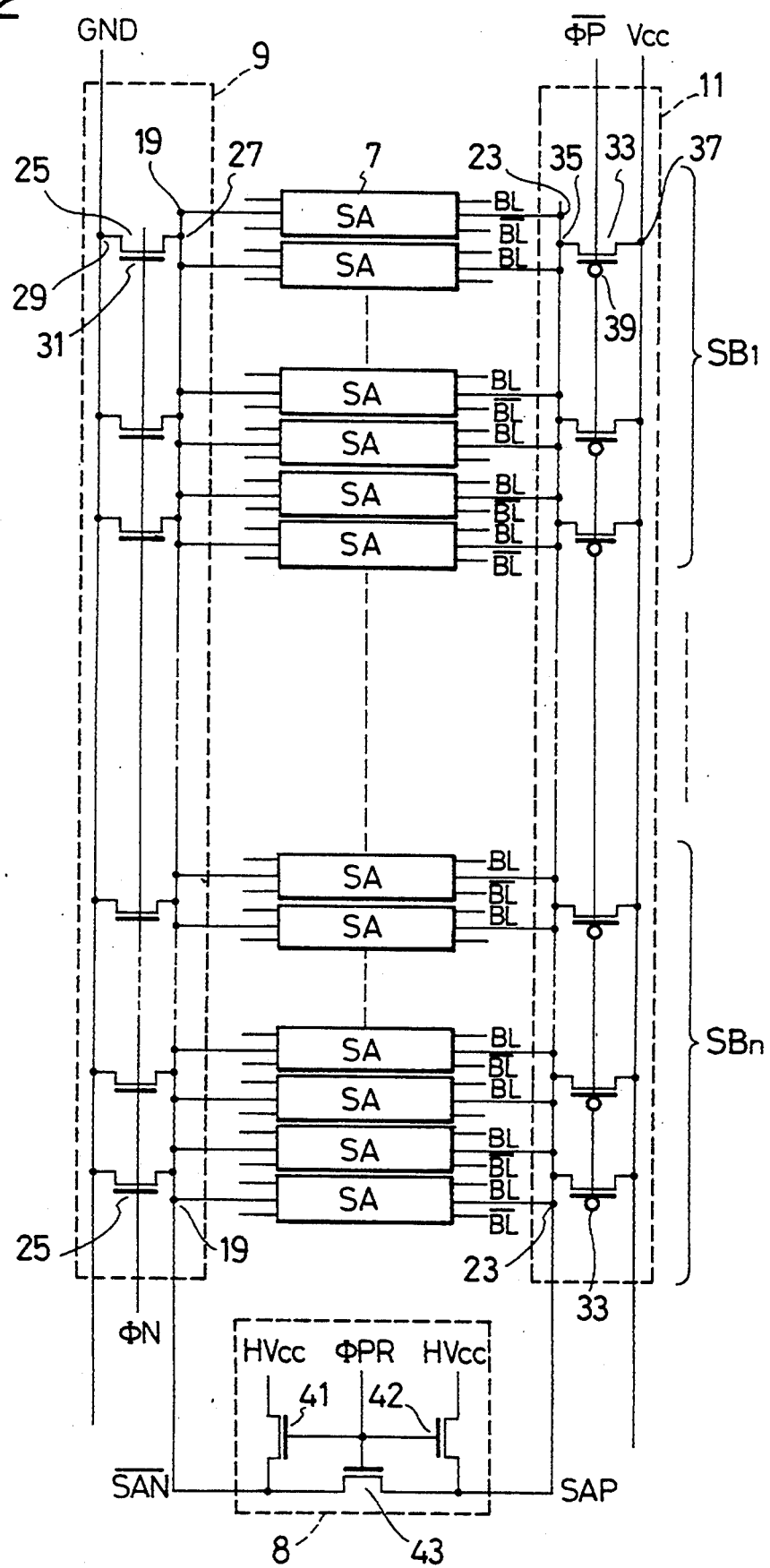
FIG. 2 shows sense amplifiers and their associated control circuits, illustrating a first embodiment of the invention.

FIG. 2 is a more detailed drawing of the sense amplifier area 6 in FIG. 1, showing the sense amplifiers 7 and their associated circuits. These include a precharge circuit 8 and a first embodiment of the invented control circuit. This embodiment comprises two independent control circuits 9 and 11. The sense amplifiers 7 are grouped into subblocks $SB_1, \ldots, SB_n$ corresponding to the sections 5 in FIG. 1. For example, subblock $SB_1$ comprises the sense amplifiers 7 disposed in the top section 5 in FIG. 1, and $SB_n$ comprises the sense amplifiers 7 disposed in the bottom section 5 in FIG. 1.

Figure 3:
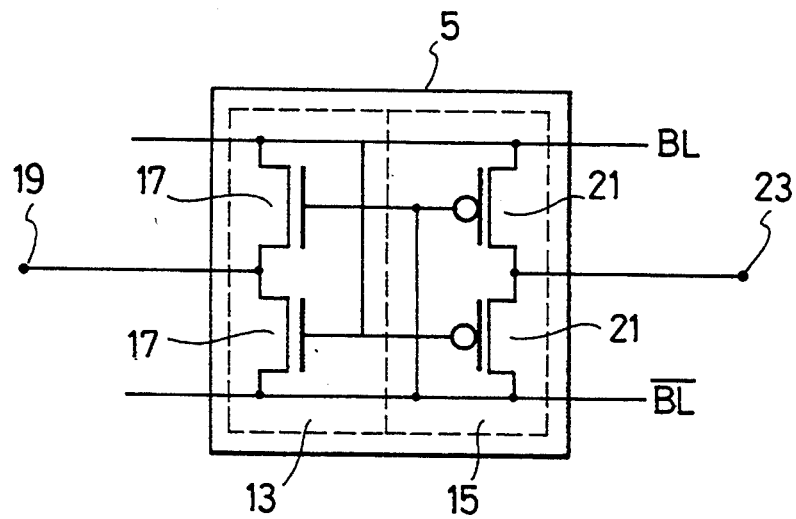
FIG. 3 illustrates the structure of a sense amplifier.

FIG. 3 is a more detailed drawing of one sense amplifier 7. The sense amplifier consists of an n-channel amplifier 13 and a p-channel amplifier 15. The n-channel amplifier 13 comprises a pair of n-channel metal-oxide-semiconductor field-effect transistors (hereinafter, NMOS transistors) 17, and is coupled at a point between these transistors 17 to a first node 19. The p-channel amplifier 15 comprises a pair of p-channel metal-oxide-semiconductor field-effect transistors (hereinafter, PMOS transistors) 21, and is coupled at a point between these transistors 21 to a second node 23. The gates of the NMOS and PMOS transistors 17 and 21 are cross-coupled to a pair of complementary bit lines BL and $\overline{BL}$ as shown.

Referring again to FIG. 2, the first nodes 19 and second nodes 23 of all the sense amplifiers 7 are disposed in the two control circuits 9 and 11 that constitute the first embodiment of the invention. The precharge circuit 8 is coupled by a first supply line $\overline{SAN}$ to all the first nodes 19, and by a second supply line SAP to all the second nodes 23.

Control circuit 9 comprises a plurality of NMOS control transistors 25, the drain electrodes 27 of which are coupled to the first supply line $\overline{SAN}$. In FIG. 2 each drain electrode 27 is directly coupled, in parallel, to two adjacent first nodes 19. Since the drain electrode 27 is disposed adjacent these two first nodes 19, there is very little electrical resistance between the transistor 25 and these two nodes 19. Since the first nodes 19 are all interconnected, the drain electrode 27 is coupled in series to the other first nodes 19 as well, but with greater electrical resistance.

The source electrodes 29 of the NMOS control transistors 25 are all coupled to a first power-supply potential, more specifically to a ground potential (GND). In FIG. 2 the source electrodes 29 are shown all coupled to a single ground line, but this is not a restriction. The source electrodes 29 may be coupled to separate ground lines, or at separate points to a ground plane.

The gate electrodes 31 of the NMOS control transistors 25 are coupled in parallel to a first control signal line $\Phi N$.

Control circuit 11 similarly comprises a plurality of PMOS control transistors 33, the drain electrodes 35 of which are coupled in parallel to pairs of adjacent second nodes 23, the source electrodes 37 of which are coupled to a second power-supply potential (Vcc), and the gate electrodes 39 of which are coupled in parallel to a second control signal line $\Phi P$.

In FIG. 2 there is one NMOS control transistor 25 and one PMOS control transistor 33 for every two sense amplifiers 7. The invention may also be practiced with one NMOS and one PMOS control transistor for every three sense amplifiers, or for every four sense amplifiers. That is, the drain electrodes of the NMOS or PMOS control transistors 25 and 33 may be coupled in parallel to three or four first or second nodes, instead of just two. With more than four sense amplifiers per control transistor, however, it becomes impractical to lay out the circuit so that the control transistor is close to all of the corresponding sense-amplifier nodes.

The invention may furthermore be practiced with the drain electrode 27 of each NMOS control transistor 25 coupled to two (or three, or four) first nodes as above, but with the drain electrode 35 of each PMOS control transistor 33 coupled to a larger number of second control nodes. For example, there may be only one PMOS control transistor 33 per subblock $SB_k$. Alternatively, the drain electrode 35 of each PMOS control transistor 33 may be coupled to two (or three, or four) second nodes, and the drain electrode 27 of each NMOS control transistor 25 to a larger number of first control nodes.

The precharge circuit 8 comprises three NMOS transistors 41, 42, and 43 that couple the supply lines $\overline{SAN}$ and SAP to each other and to a potential (HVcc) intermediate between Vcc and ground. The gate electrodes of all three transistors 41, 42, and 43 are driven by a precharge control signal $\Phi PR$.

Figure 4:
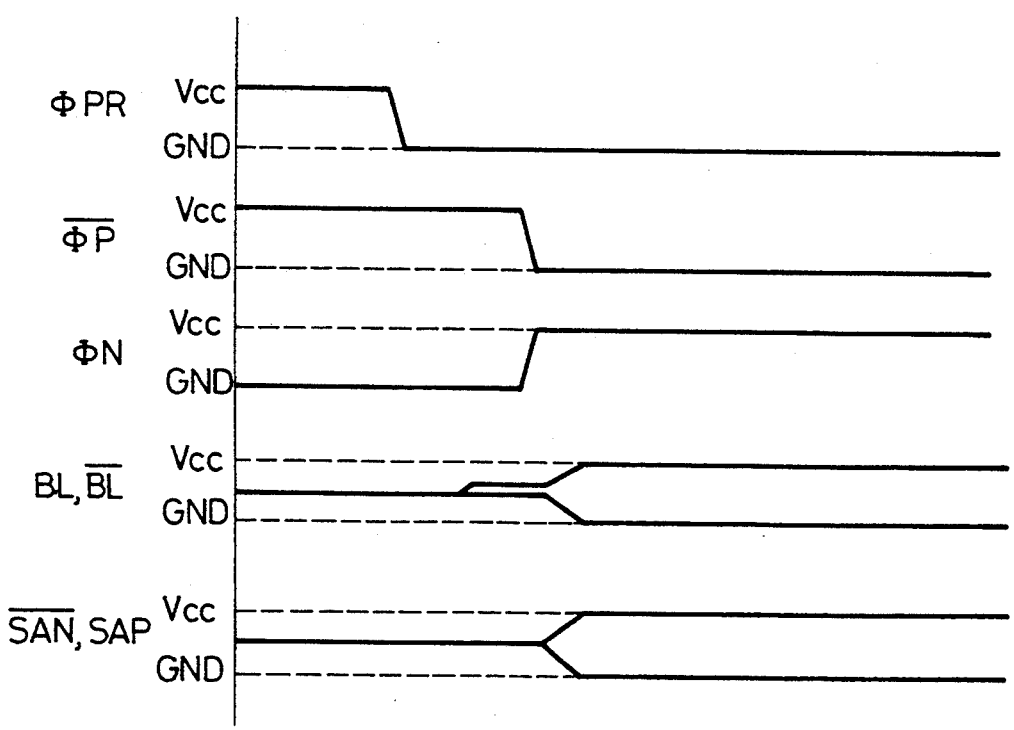
FIG. 4 shows waveforms illustrating the general operation of the invention.

Next the operation of the circuits in FIG. 2 will be described with reference to FIG. 4. The description will be confined to the case of read access.

Initially, the precharge signal $\Phi PR$ is active and the first and second control signal lines $\Phi N$ and $\Phi P$ are inactive. Specifically, $\Phi PR$ and $\Phi P$ are high and $\Phi N$ is low. As a result, the transistors 41, 42, and 43 in the precharge circuit 8 are turned on, and the NMOS and PMOS control transistors 25 and 33 are all off. The first and second supply lines $\overline{SAN}$ and SAP are precharged to the potential HVcc intermediate between Vcc and ground. The bit lines BL and $\overline{BL}$ are also precharged to this potential, through circuits not shown in the drawings.

When a read access occurs, first the precharge signal $\Phi PR$ is deactivated and a word line is activated, coupling one bit line in each pair of complementary bit lines to a charge stored in a memory cell. Depending on the value of this charge, the potential of the bit line is pulled slightly up or down (up in the drawing), causing the potentials of the two complementary bit lines BL and $\overline{BL}$ to diverge slightly.

Next the first and second control signals $\Phi N$ and $\Phi P$ are activated, switching on all the NMOS and PMOS control transistors 25 and 33. The potentials of the first nodes 17 now change to the ground level, and the potentials of the second nodes 23 to Vcc. In FIG. 4 this is shown as a divergence of the potentials of the supply lines $\overline{SAN}$ and SAP. This activates the sense amplifiers 7, which cause the bit lines BL and $\overline{BL}$ likewise to diverge to Vcc and ground.

Figure 5:
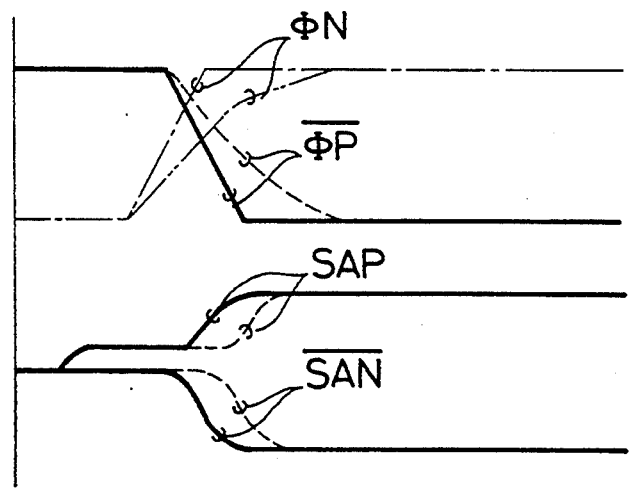
FIG. 5 shows more detailed waveforms for the control signal lines and supply lines.

FIG. 5 shows the waveforms on the first and second control signals ΦN and ΦP and supply lines $\overline{\text{SAN}}$ and SAP in more detail. Two waveforms are shown for each signal line. The dot-dash waveform on the ΦN signal line represents the waveform at an NMOS control transistor 25 near the ΦN signal source, that is, near the bottom left in FIG. 2. The dot-dot-dash waveform represents the waveform at an NMOS control transistor 25 farther from the ΦN signal source, e.g. near the top left in FIG. 2. The delay between these two waveforms is due to parasitic resistance on the first control signal line ΦN.

Similarly, the solid waveform on the ΦP control signal line is for a PMOS control transistor 33 disposed near the ΦP signal source, at the upper right in FIG. 2, and the dotted waveform is for a PMOS control transistor 33 disposed farther away, near the bottom right in FIG. 2. The delay between these two waveforms is due the parasitic resistance on the second control signal line ΦP.

Most of the potential change on the $\overline{\text{SAN}}$ and SAP supply lines takes place in response to the ΦN and ΦP transitions that turn on the NMOS and PMOS control transistors. The potentials of sense-amplifier nodes disposed near the bottom left and top right in FIG. 2, indicated by solid $\overline{\text{SAN}}$ and SAP waveforms in FIG. 5, therefore diverge toward ground and Vcc before the potentials of sense-amplifier nodes disposed near the top left and bottom right in FIG. 2, indicated by dotted waveforms in FIG. 5. Once a control transistor does turn on, however, the potentials at the two directly-connected sense-amplifier nodes rise or fall promptly to Vcc or ground, because there is very little resistance between the node and the control transistor. The rise or fall of the node potential is not delayed by parasitic resistance on the $\overline{\text{SAN}}$ or SAP supply line.

Figure 6:
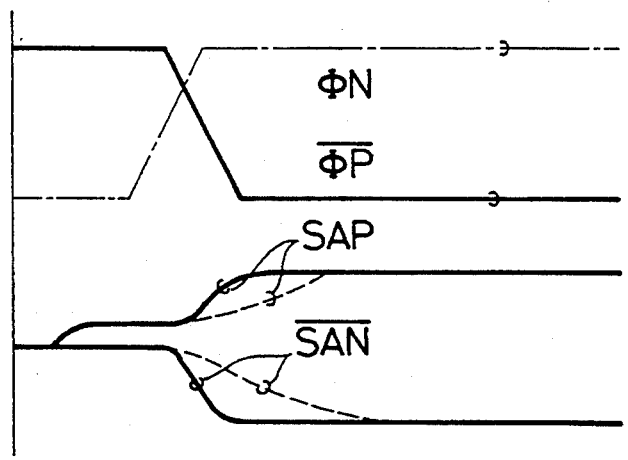
FIG. 6 shows corresponding waveforms for the control signal lines and supply lines of a conventional control circuit.

FIG. 6 shows the contrasting case of a conventional control circuit in which the supply lines $\overline{\text{SAN}}$ and SAP are each driven by a single control transistor, The solid lines represent the $\overline{\text{SAN}}$ and SAP waveforms at points near these control transistors. The dotted lines represent waveforms at points distant from these control transistors. The delay between different points on the $\overline{\text{SAN}}$ or SAP supply line is considerably greater in FIG. 6 than in FIG. 5, resulting in overall slower operation of the memory.

The control circuit in FIG. 2 solves several of the other problems noted in the prior art. It reduces ground and Vcc noise, because the sense amplifiers are coupled (through the control transistors) to the ground and Vcc lines at a large number of points, instead of just one. Since the control transistors are not confined to the word-line shunt areas 4, they can have adequate total gate width. Furthermore, since there is one NMOS or PMOS control transistor for every two sense amplifiers, the gates of the control transistors can be wide enough that narrow-channel effects do not become evident, and fabrication variability does not seriously affect transistor characteristics.

Figure 7:
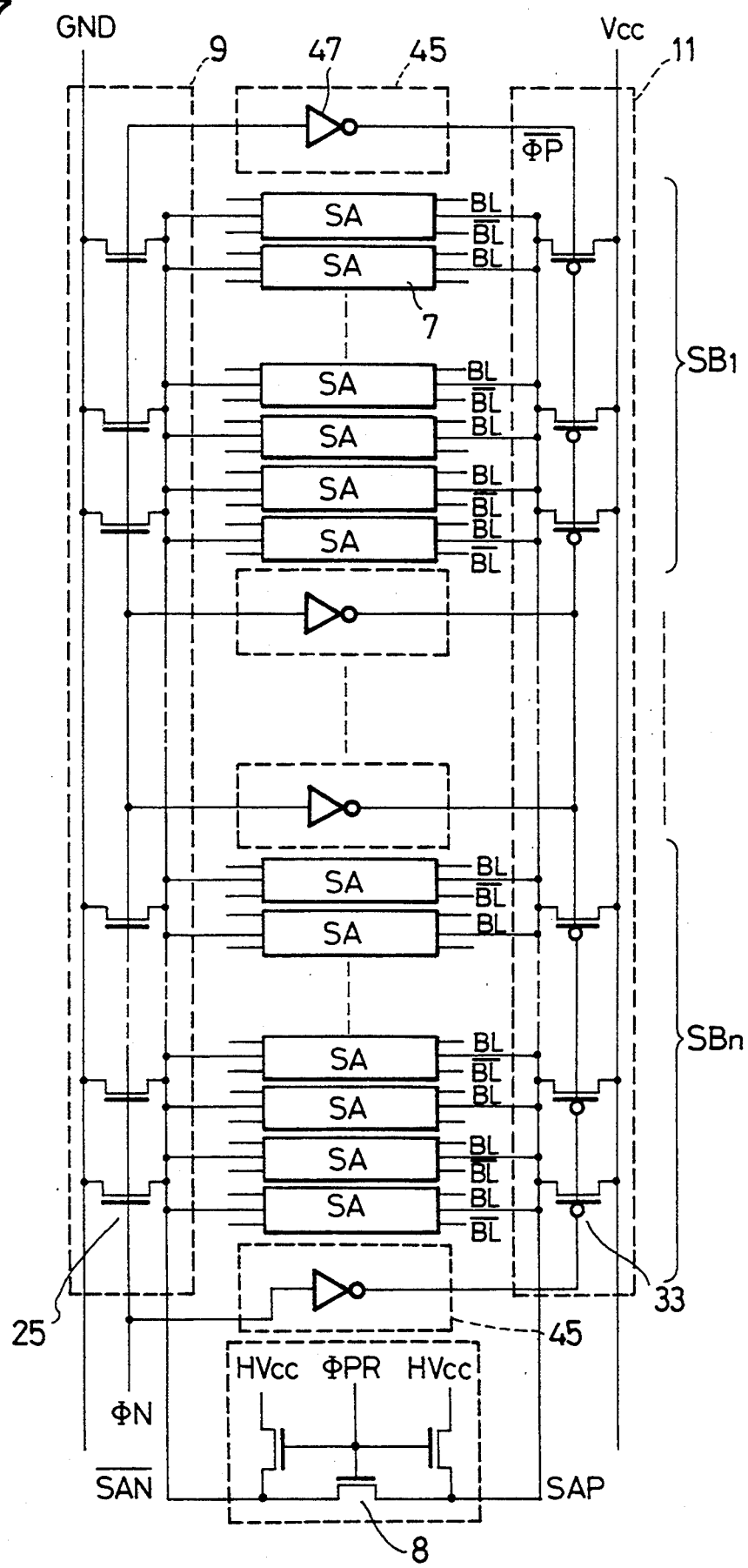
FIG. 7 shows sense amplifiers and their associated control circuits, illustrating a second embodiment of the invention.

FIG. 7 shows a second embodiment of the invention. Circuit elements identical to elements in FIG. 2 are identified with the same reference numerals, and descriptions of these elements will be omitted.

The new elements in FIG. 7 are a plurality of drivers 45 disposed between the first and second control signal lines ΦN and ΦP and coupled in parallel to these lines. Each driver 45 consists of a single inverter 47, the input side of which is coupled to $\overline{\text{SAN}}$ and the output side of which is coupled to SAP. One driver 45 is provided between each pair of mutually adjacent subblocks $SB_k$ and $SB_{k+1}$, with one additional driver 45 above the first subblock $SB_1$ and one driver 45 below the last subblock $SB_n$. The drivers are disposed in the word-line shunt areas 4 in FIG. 1.

With the second control signal line ΦP driven from the first control signal line ΦN in this way, only one control signal (ΦN) has to be input to the control circuit from the outside. Furthermore, since the second control signal line ΦP is driven at a plurality of points in parallel, operation of the control circuit is not slowed by parasitic resistance on the ΦP signal line.

Figure 8:
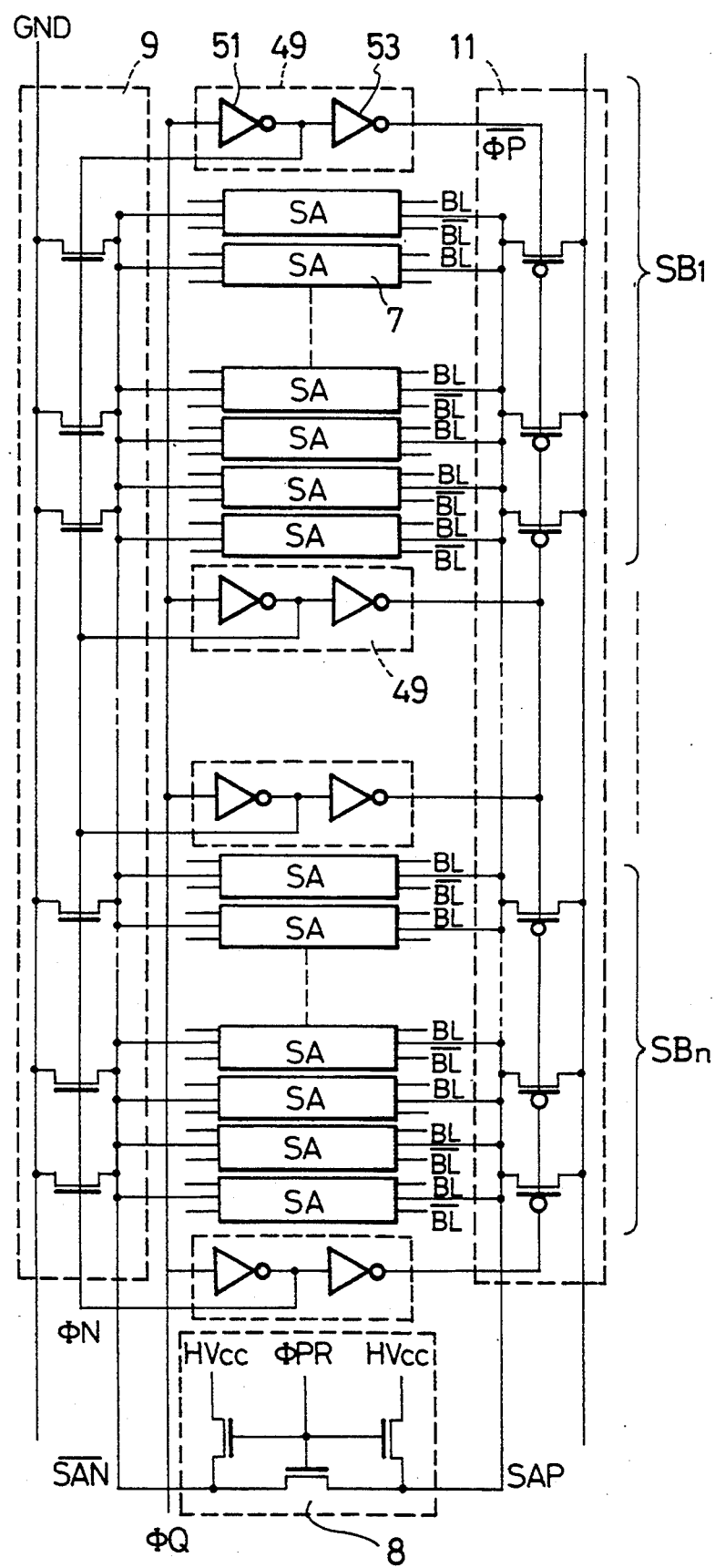
FIG. 8 shows sense amplifiers and their associated control circuits, illustrating a third embodiment of the invention.

FIG. 8 shows a third embodiment of the invention. Circuit elements identical to elements in FIG. 2 are again identified with the same reference numerals, and descriptions of these elements will again be omitted.

FIG. 8 has a plurality of drivers 49 disposed in the same locations as the drivers 45 in FIG. 7, and coupled in parallel to the first and second control signal lines ΦN and ΦP. Each driver 49 comprises a pair of inverters 51 and 53 connected in series. The input side of the first inverter 51 is coupled to a third control signal line ΦQ. The output of the first inverter 51 is coupled to the first control signal line ΦN, and to the input side of the second inverter 53. The output of the second inverter 53 is coupled to the second control signal line ΦP. The drivers 49 accordingly drive both the first and second control signal lines ΦN and ΦP.

Since the first and second control signal lines ΦN and ΦP are both driven at a number of points, more specifically, at one point on either side of each subblock $SB_k$, operation of the control circuit is not significantly slowed by the parasitic resistance of either the first or the second control signal line. Nor is operation slowed by the parasitic resistance of the third signal line ΦQ, because this signal line is lightly loaded. That is, the ΦQ signal line only has to drive one inverter 51 in each of the drivers 49, and the inverters 51 and 53 in the drivers 49 do not present heavy loads because they only drive the gates of the control transistors 25 and 33, and do not drive the sense amplifiers themselves.

Figure 9:
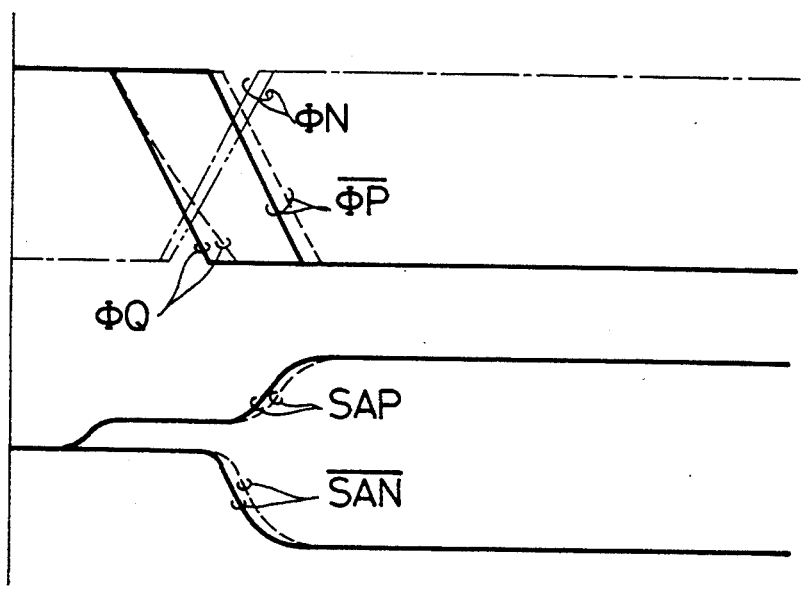
FIG. 9 shows waveforms for the control signal lines and supply lines of the third embodiment.

FIG. 9 shows waveforms on the ΦN, ΦP, and ΦQ control signal lines and on the $\overline{\text{SAN}}$ and SAP supply lines, showing two waveforms for each. For ΦQ, the solid line represents the waveform at a point relatively near the signal source, that is, near the bottom of FIG. 8. The dotted line represents the waveform at a point relatively far from the signal source, that is, near the top of FIG. 8. Despite the length of the ΦQ signal line, the dotted waveform is delayed only slightly from the solid waveform, because of the light loading.

Similarly, for ΦN, the dot-dash line represents the waveform at a point near the bottom of FIG. 8, and the dot-dot-dash line represents the waveform at a point near the bottom of FIG. 8. The delay between these two waveforms, which results from the delay between the two ΦQ waveforms, is again only slight.

For ΦP, $\overline{\text{SAN}}$, and SAP, the solid and dotted lines again represent waveforms at points near the top and bottom of FIG. 8, respectively. Once again the delay between these two waveforms is slight. The delay from the rise of ΦN to the fall of ΦP, which is the delay of the extra inverter 53, is also slight, and the delay from the fall of $\overline{\text{SAN}}$ to the rise of SAP is correspondingly slight. The effect of the driver circuits 49 can be seen by comparing FIG. 9 with FIGS. 5 and 6, in which there are larger delays on the $\overline{\text{SAN}}$ and SAP lines.

Those skilled in the art will recognize that the preceding embodiments can be modified in various ways without departing from the scope of the invention as claimed below.

What is claimed is:

1. A sense amplifier control circuit for switching sense amplifiers on and off in a semiconductor memory, comprising:

a plurality of first nodes disposed adjacent and coupled to respective sense amplifiers;

a plurality of second nodes disposed adjacent and coupled to respective sense amplifiers;

a plurality of first control transistors, each first control transistor having a source electrode, a gate electrode, and a drain electrode, said source electrode being coupled to a first power-supply potential, and said drain electrode being coupled in parallel to at least two and at most four of said first nodes;

a plurality of second control transistors, each second control transistor having a source electrode, a gate electrode, and a drain electrode, the source electrode of each second control transistor being coupled to a second power-supply potential, and the drain electrode of each second control transistor being coupled to a plurality of said second nodes;

a first control signal line coupled to the gate electrode of each said first control transistor; and a second control signal line coupled to the gate electrode of each said second control transistor.

2. The circuit of claim 1, wherein all of said first nodes are mutually interconnected and all of said second nodes are mutually interconnected.

3. The circuit of claim 1, wherein the drain electrode of each said second control transistor is coupled in parallel to at least two and at most four of said second nodes.

4. The circuit of claim 3, further comprising:

a plurality of drivers coupled in parallel between said first control signal line and said second control signal line, for driving one of these two signal lines.

5. The circuit of claim 4, wherein each of said drivers comprises an inverter.

6. A sense amplifier control circuit for switching sense amplifiers on and off in a semiconductor memory, comprising:

a plurality of first nodes disposed adjacent and coupled to respective sense amplifiers;

a plurality of second nodes disposed adjacent and coupled to respective sense amplifiers;

a plurality of first control transistors, each first control transistor having a source electrode, a gate electrode, and a drain electrode, said source electrode being coupled to a first power-supply potential, and said drain electrode being coupled in parallel to at least two and at most four of said first nodes;

a plurality of second control transistors, each second control transistor having a source electrode, a gate electrode, and a drain electrode, the source electrode of each second control transistor being coupled to a second power-supply potential, and the drain electrode of each second control transistor being coupled in parallel to at least two and at most four of said second nodes;

a first control signal line coupled to the gate electrode of each said first control transistor;

a second control signal line coupled to the gate electrode of each said second control transistor; and a plurality of drivers coupled in parallel between said first control signal line and said second control signal line, for driving one of these two signal lines, wherein said sense amplifiers are grouped into subblocks, and wherein one driver among said drivers is disposed between each mutually adjacent pair of said subblocks.

7. The circuit of claim 6, wherein said semiconductor memory is divided into sections separated by word-line shunt areas, and said drivers are disposed in said word-line shunt areas.

8. A sense amplifier control circuit for switching sense amplifiers on and off in a semiconductor memory, comprising:

a plurality of first nodes disposed adjacent and coupled to respective sense amplifiers;

a plurality of second nodes disposed adjacent and coupled to respective sense amplifiers;

a plurality of first control transistors, each first control transistor having a source electrode, a gate electrode, and a drain electrode, said source electrode being coupled to a first power-supply potential, and said drain electrode being coupled in parallel to at least two and at most four of said first nodes;

a plurality of second control transistors, each second control transistor having a source electrode, a gate electrode, and a drain electrode, the source electrode of each second control transistor being coupled to a second power-supply potential, and the drain electrode of each said second control transistor being coupled in parallel to at least two and at most four of said second nodes;

a first control signal line coupled to the gate electrode of each said first control transistor;

a second control signal line coupled to the gate electrode of each said second control transistor;

a plurality of drivers coupled in parallel between said first control signal line and said second control signal line, for driving said first control signal line and said second control signal line; and a third control signal line coupled to said drivers, for controlling said drivers.

9. The circuit of claim 8, wherein each of said drivers comprises a pair of inverters coupled in series to said third control signal line.

10. The circuit of claim 8, wherein said sense amplifiers are grouped into subblocks, and one driver among said drivers is disposed between each mutually adjacent pair of said subblocks.

11. The circuit of claim 10, wherein said semiconductor memory is divided into sections separated by word-line shunt areas, and said drivers are disposed in said word-line shunt areas.

12. A method of controlling sense amplifiers in a semiconductor integrated memory, comprising the steps of:

switching a first plurality of first control transistors by means of a first control signal line, to which said first control transistors are connected; and supplying a first potential through each first control transistor in said plurality of first control transistors to at least two and at most four of said sense amplifiers which are coupled to said first control transistor in parallel.

13. The method of claim 12, comprising the further steps of:
   switching a second plurality of second control transistors by means of a second control signal line, to which said second control transistors are connected; and
   supplying a second potential through each second control transistor in said plurality of second control transistors to at least two and at most four of said sense amplifiers which are coupled to said second control transistor in parallel.

14. The method of claim 13, comprising the further steps of:
   switching a plurality of drivers by means of said first control signal line; and
   driving said second control signal line at a plurality of points by means of said drivers.

15. The method of claim 14, wherein said drivers comprise inverters.

16. A method of controlling sense amplifiers in a semiconductor integrated memory comprising the steps of:
   switching a first plurality of first control transistors by means of a first control signal line, to which said first control transistors are connected;
   supplying a first potential through each first control transistor in said plurality of first control transistors to at least two and at most four of said sense amplifiers which are coupled to said first control transistor in parallel;
   switching a second plurality of second control transistors by means of a second control signal line, to which said second control transistors are connected;
   supplying a second potential through each second control transistor in said plurality of second control transistors to at least two and at most four of said sense amplifiers which are coupled to said second control transistor in parallel;
   switching a plurality of drivers by means of a third control signal line;
   driving said first control signal line at a plurality of points by means of said drivers; and
   driving said second control signal line at a plurality of points by means of said drivers.

17. The method of claim 16, wherein each driver in said plurality of drivers comprises a pair of inverters coupled in series.

* * * * *